(12) United States Patent
Kawakami et al.

(10) Patent No.: US 8,771,828 B2
(45) Date of Patent: Jul. 8, 2014

(54) SEALING FILM AND A SEMICONDUCTOR DEVICE USING THE SAME

(75) Inventors: Hiroyuki Kawakami, Ichihara (JP); Katsuyasu Niijima, Ichihara (JP); Naoki Tomori, Ichihara (JP); Daichi Takemori, Chiba (JP); Takuya Imai, Ichihara (JP)

(73) Assignee: Hitachi Chemical Company, Ltd., Tokyo (JP)

( * ) Notice: Subject to any disclaimer, the term of this patent is extended or adjusted under 35 U.S.C. 154(b) by 685 days.

(21) Appl. No.: 12/299,714

(22) PCT Filed: Jan. 24, 2008

(86) PCT No.: PCT/JP2008/050978
§ 371 (c)(1),
(2), (4) Date: Nov. 5, 2008

(87) PCT Pub. No.: WO2008/090950
PCT Pub. Date: Jul. 31, 2008

(65) Prior Publication Data
US 2009/0189300 A1    Jul. 30, 2009

(30) Foreign Application Priority Data
Jan. 26, 2007  (JP) ............... P2007-016891
Apr. 18, 2007  (JP) ............... P2007-109316

(51) Int. Cl.
| | |
|---|---|
| *H01L 23/28* | (2006.01) |
| *B32B 27/38* | (2006.01) |
| *B32B 27/20* | (2006.01) |
| *C08K 3/36* | (2006.01) |
| *H01L 23/29* | (2006.01) |
| *C08G 59/62* | (2006.01) |
| *C08L 63/00* | (2006.01) |
| *C08K 3/00* | (2006.01) |

(52) U.S. Cl.
CPC ............ *H01L 23/293* (2013.01); *H01L 23/295* (2013.01); *C08G 59/621* (2013.01); *C08L 63/00* (2013.01); *C08K 3/0033* (2013.01); *C08L 2666/54* (2013.01); *C08L 2666/72* (2013.01)

USPC .......... 428/220; 428/323; 428/332; 428/413; 257/793; 257/789

(58) Field of Classification Search
CPC ............................. C08L 63/00; C08K 3/0033
USPC .............. 428/212–216, 220, 411.1, 413–418, 428/421, 473.5–477.5, 480–483, 500–506, 428/323–325, 328–389, 343–355 EN; 257/787–795, E23.116; 528/86–219; 524/493–497; 525/107–119
See application file for complete search history.

(56) References Cited

U.S. PATENT DOCUMENTS
4,904,761 A    2/1990 Okitsu et al.
(Continued)

FOREIGN PATENT DOCUMENTS
JP    05-190697    7/1993
(Continued)

OTHER PUBLICATIONS
Machine Translation of JP2005-060584. Retrieved Jun. 23, 2011.*
(Continued)

*Primary Examiner* — Prashant J Khatri
(74) *Attorney, Agent, or Firm* — Antonelli, Terry, Stout & Kraus, LLP.

(57) ABSTRACT

A sealing film which includes a resin layer having a flow within the range of 150 to 1800 μm at 80° C., or having a resin layer with a viscosity within the range of 10000 to 100000 Pa·s in a B-stage state at 50 to 100° C. in thermosetting viscoelasticity measurement, and containing: (A) both (a1) a high-molecular-weight component including crosslinking functional groups and having a weight-average molecular weight of 100,000 or more and a Tg within the range of −50 to 50° C., and (a2) a thermosetting component including an epoxy resin as a main component, (B) a filler having an average particle size within the range of 1 to 30 μm, and (C) a colorant, as well as a manufacturing method thereof and a semiconductor device using the same.

16 Claims, 2 Drawing Sheets

(56) References Cited

U.S. PATENT DOCUMENTS

| | | | |
|---|---|---|---|
| 5,985,455 | A | 11/1999 | Tokunaga et al. |
| 6,294,271 | B1 | 9/2001 | Sumita et al. |
| 6,372,351 | B1 * | 4/2002 | Takemiya et al. ............. 428/416 |
| 6,673,441 | B1 * | 1/2004 | Tanaka et al. ........... 428/355 EP |
| 2002/0089071 | A1 * | 7/2002 | Sumita et al. ................. 257/793 |
| 2003/0159773 | A1 | 8/2003 | Tomiyama et al. |

FOREIGN PATENT DOCUMENTS

| | | |
|---|---|---|
| JP | 05-283456 | 10/1993 |
| JP | 08-073621 | 3/1996 |
| JP | 10-287795 | 10/1998 |
| JP | 2004-043761 | 2/2004 |
| JP | 2005-060584 | 3/2005 |
| JP | 2006-183020 | 7/2006 |
| JP | 2006-321216 | 11/2006 |
| WO | WO 2003/018703 A1 | 3/2003 |

OTHER PUBLICATIONS

Tatsumori Datasheet: TSS-Series. Retrieved Jun. 24, 2011.*
Translation of the International Preliminary Report on Patentability mailed Aug. 6, 2009, for Application No. PCT/JP2008/050978 (Form PCT/IB/338).
Korean Official Action issued on Oct. 25, 2010, for KR Application No. 10-2008-7026980.
Chinese Official Action issued on Jun. 7, 2010, for Application No. 2008800002391.
Japanese Official Action issued on Nov. 27, 2012, for JP Application No. 2007-016891.
Extended European Search Report, including Supplementary European Search Report and European Search Opinion, dated Aug. 1, 2013, for EP Application No. 08703806.3-1552/2110851 (PCT/JP2008/050978).
Taiwanese Official Action issued on Apr. 19, 2012, for TW Application No. 1012037644001.

* cited by examiner

SEALING FILM AND A SEMICONDUCTOR DEVICE USING THE SAME

TECHNICAL FIELD

The present invention relates to a sealing film excellent in filling properties and adhesiveness and a semiconductor device using the same. The present invention relates in particular to a sealing film which has protective functions and filling properties, which is used for protecting and filling a semiconductor chip, and which is excellent in filling properties, adhesiveness and shape retention by regulating fluidity at the time of filling, as well as a semiconductor device using the same.

BACKGROUND ART

Conventionally, downsizing and weight saving of electronics devices have been advancing, and with this advancement, there is demand for high-density package on substrates, and the downsizing, thinning and weight saving of semiconductor packages mounted on electronics devices are progressing. Conventionally, there have been packages called LOC (Lead On Chip) and QFP (Quad Flat Package), and packages such as μBGA (Ball Grid Array) and CSP (Chip Size Package) that are smaller and lighter than the packages such as LOC and QFP have been developed. Face-down type packages that are a flip chip, WL-CSP (Wafer Level Chip Size Package) etc. wherein a circuit surface of a semiconductor element is faced to the surface of a semiconductor interconnection substrate, have also been developed.

In the packages described above, sealed packages are obtained by transfer-molding a solid epoxy resin sealing material, but it is difficult to mold thin or large packages. When the content of inorganic fillers is increased, melt viscosity is generally increased at the time of transfer molding, to cause problems such as an increase of residual voids at the time of molding, of insufficient filling in a cavity, of wire flow and of stage shift, and deteriorations in the qualities of a molded product.

In recent years, some of the flip chips, WL-CSP etc. have protruded electrodes, and for protecting such protrusions and filling a gap between the protrusions, a sealing material has sometimes been used, but it has been difficult to fill thereof with a solid epoxy resin sealing material. Accordingly, a sealing film comprising an epoxy resin and an inorganic filler has been proposed (refer to, for example, Japanese Patent and 2005-60584).

DISCLOSURE OF INVENTION

However, when a conventional sealing film is used to seal, for example, a package having protruded electrodes or a package having a shape restricted after sealing, it is difficult to regulate to fluidity, and filling properties and adhesiveness cannot be satisfied in some cases.

An object of the present invention is to provide a sealing film which has protective functions and filling properties, which is used for protecting and filling a semiconductor chip, and which is excellent in filling properties, adhesiveness and shape retention by regulating fluidity at the time of filling, as well as a semiconductor device using the same.

The present invention is characterized by features described in the following (1) to (13):

(1) A sealing film which comprises a resin layer containing the following (A), (B) and (C) and having a flow within the range of 150 to 1800 μm at 80° C.:

(A) a resin component containing (a1) a high-molecular-weight component comprising crosslinking functional groups and having a weight-average molecular weight of 100,000 or more and a Tg within the range of −50 to 50° C. and (a2) a thermosetting component comprising an epoxy resin as a main component, (B) a filler having an average particle size within the range of 1 to 30 μm, and (C) a colorant.

(2) A sealing film which comprises a resin layer containing the following (A), (B) and (C) and having a viscosity within the range of 10000 to 100000 Pa·s in a B-stage state at 50 to 100° C. in thermosetting viscoelasticity measurement:

(A) a resin component containing (a1) a high-molecular-weight component comprising crosslinking functional groups and having a weight-average molecular weight of 100,000 or more and a Tg within the range of −50 to 50° C. and (a2) a thermosetting component comprising an epoxy resin as a main component, (B) a filler having an average particle size within the range of 1 to 30 μm, and (C) a colorant.

(3) The sealing film according to the above-mentioned (1), which contains 1 to 300 parts by mass of the filler (B) and 0.01 to 10 parts by mass of the colorant (C), based on 10 parts by mass of the resin component (A) containing 5 to 85% by mass of the high-molecular-weight component (a1) and 15 to 95% by mass of the thermosetting component (a2).

(4) The sealing film according to the above-mentioned (1) or (2), wherein the resin component (A) contains 5 to 80% by mass of the high-molecular-weight component (a1) and 15 to 85% by mass of the thermosetting component (a2).

(5) The sealing film according to the above-mentioned (4), which contains 1 to 300 parts by mass of the filler (B) and 0.01 to 10 parts by mass of the colorant (C), based on 10 parts by mass of the resin component (A).

(6) The sealing film according to any one of the above-mentioned (1) to (5), further comprising a substrate layer within the range of 5 to 300 μm in thickness on one side of the resin layer, and the thickness of the resin layer is within the range of 5 to 800 μm.

(7) The sealing film according to any one of the above-mentioned (1) to (6), further comprising a substrate layer within the range of 5 to 300 μm in thickness on one side of the resin layer and a protective layer within the range of 5 to 300 μm in thickness on the other side of the resin layer, and the thickness of the resin layer is within the range of 5 to 800 μm.

(8) The sealing film according to any one of the above-mentioned (1) to (7), wherein the filler (B) is an inorganic filler.

(9) The sealing film according to any one of the above-mentioned (1) to (8), wherein the colorant (C) is a non-white colorant.

(10) The sealing film according to any one of the above-mentioned (1) to (9), wherein the storage elastic modulus of the resin layer at 35° C. after curing at 170° C. for 1 hour is within the range of 100 to 20000 MPa.

(11) A semiconductor device using the sealing film according to any one of the above-mentioned (1) to (10).

(12) A method for manufacturing a sealing film comprising a resin layer with a flow within the range of 150 to 1800 μm at 80° C., which method comprises the steps of:

preparing a varnish by adding a solvent to a resin layer component containing the following (A), (B) and (C):

(A) a resin component containing (a1) a high-molecular-weight component comprising crosslinking functional groups and having a weight-average molecular weight of 100,000 or more and a Tg within the range of −50 to 50° C. and (a2) a thermosetting component comprising an epoxy resin as a main component, (B) a filler having an average particle size within the range of 1 to 30 µm, and (C) a colorant, applying the varnish onto a substrate layer or a substrate, and drying the applied varnish at least once by heating at a temperature within the range of 60 to 200° C. for 3 to 30 minutes.

(13) A method for manufacturing a sealing film comprising a resin layer having a viscosity within the range of 10000 to 100000 Pa·s in a B-stage state at 50 to 100° C. in thermosetting viscoelasticity measurement, which method comprises the steps of:

preparing a varnish by adding a solvent to a resin layer component containing the following (A), (B) and (C):

(A) a resin component containing (a1) a high-molecular-weight component comprising crosslinking functional groups and having a weight-average molecular weight of 100,000 or more and a Tg within the range of −50 to 50° C. and (a2) a thermosetting component comprising an epoxy resin as a main component, (B) a filler having an average particle size within the range of 1 to 30 µm, and (C) a colorant, applying the varnish onto a substrate layer or a substrate, and drying the applied varnish at least once by heating at a temperature within the range of 60 to 200° C. for 3 to 30 minutes.

BEST MODE FOR CARRYING OUT THE INVENTION

Figure 1:
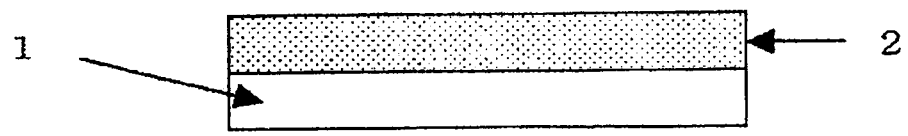
FIG. 1 is a schematic view of a sealing film comprising a substrate layer 1 and a resin layer 2.

The resin layer constituting the sealing film of the present invention contains the following (A), (B) and (C) and has a flow within the range of 150 to 1800 µm at 80° C.:

(A) a resin component containing (a1) a high-molecular-weight component comprising crosslinking functional groups and having a weight-average molecular weight of 100,000 or more and a Tg within the range of −50 to 50° C. and (a2) a thermosetting component comprising an epoxy resin as a main component, (B) a filler having an average particle size within the range of 1 to 30 µm, and (C) a colorant.

The resin layer constituting the sealing film of the present invention contains the resin component (A), the filler (B) and the colorant (C) and has a viscosity within the range of 10000 to 100000 Pa·s in a B-stage state at 50 to 100° C. in thermosetting viscoelasticity measurement.

Hereinafter, the materials used in the present invention are described.

<High-Molecular-Weight Component (a1)>

The high-molecular-weight component (a1) comprising crosslinking functional groups and having a weight-average molecular weight of 100,000 or more and a Tg within the range of −50 to 50° C., constituting the resin component (A) used in the present invention, is not particularly limited, and is preferably an epoxy group-comprising (meth)acrylic copolymer comprising a monomer having a crosslinking functional groups as a structural unit. In the present invention, "(meth)acryl" refers to both "acryl" and "methacryl". The crosslinking functional group includes an acryl group, a methacryl group, an isocyanate group, a carboxyl group and the like.

As the epoxy group-comprising (meth)acrylic copolymer, it is possible to use, for example, an epoxy group-comprising (meth)acrylate copolymer, an epoxy group-comprising acrylic rubber or the like, among which an epoxy group-comprising acrylic rubber is preferable. The acrylic rubber is a rubber consisting primarily of an acrylate and consisting essentially of a butyl acrylate/acrylonitrile copolymer, an ethyl acrylate/acrylonitrile copolymer or the like. As the epoxy group-comprising acrylic rubber having a weight-average molecular weight of 100,000 or more and a Tg within the range of −50 to 50° C., for example, HHTR-860P-3DR or the like manufactured by Nagase ChemteX Corporation is commercially available.

As the epoxy group-comprising (meth)acrylic copolymer, a copolymer prepared by polymerizing an epoxy group-comprising monomer having a crosslinking functional group, such as glycidyl (meth)acrylate, can also be used, and a copolymer prepared by copolymerizing a monomer such as ethyl (meth)acrylate and butyl (meth)acrylate with this epoxy group-comprising monomer can also be used.

The amount of the epoxy group-comprising monomer in the epoxy group-comprising (meth)acrylic copolymer is preferably 0.5 to 6.0% by mass, more preferably 0.5 to 5.0% by mass, still more preferably 0.8 to 5.0% by mass. When the amount of the epoxy group-comprising monomer is in this range, adhesion force can be secured and gelation can be prevented. When the amount of the epoxy group-comprising monomer is lower than 0.5% by mass, the adhesion of the resulting resin layer tends to be decreased, while when the amount is higher than 6.0% by mass, the storage stability of the resulting resin layer tends to be decreased.

When the above-mentioned monomer is polymerized to prepare the high-molecular-weight component (a1) having a weight-average molecular weight of 100,000 or more and a Tg within the range of −50 to 50° C., the polymerization method is not particularly limited, and known methods such as pearl polymerization, solution polymerization etc. can be used. Polymerization conditions are not particularly limited either and may be suitably determined in consideration of the monomer used, concentration thereof, the weight-average molecular weight of the high-molecular-weight component (a1), glass transition temperature thereof and the like.

In the present invention, the weight-average molecular weight of the high-molecular-weight component (a1) is 100,000 or more, preferably 300,000 to 3,000,000, more preferably 500,000 to 2,000,000. When the weight-average molecular weight is within this range, the strength, flexibility and tackiness of the resulting film are suitable, and the adhesiveness between the resin layer and an adherend can be secured. In the present invention, the weight-average molecular weight is measured by gel permeation chromatography and determined using a standard polystyrene calibration curve.

The glass transition temperature (referred to hereinafter as "Tg") of the high-molecular-weight component (a1) is preferably within the range of −50° C. to 50° C., more preferably −40° C. to 50° C., still more preferably −40° C. to 40° C. When the Tg is within the range of −50° C. to 50° C., the tackiness of the resin layer in a B-stage state is suitable and is not problematic for handleability.

The amount of the high-molecular-weight component (a1) incorporated is preferably 5 to 85% by mass, more preferably 5 to 80% by mass, still preferably 10 to 80% by mass, most preferably 10 to 75% by mass, based on the total amount of the resin component (A). When the amount of the high-molecular-weight component (a1) incorporated is lower than 5% by weight, the resulting resin layer tends to become brittle due to insufficient flexibility, while when the amount is higher than 85% by mass, the fluidity of the resulting resin layer tends to be decreased.

<Thermosetting Component (a2)>

The thermosetting component (a2) constituting the resin component (A) used in the present invention is not particularly limited insofar as it is thermally set to exhibit an adhesive action, and the thermosetting component (a2) preferably comprises an epoxy resin as main component. Examples of the epoxy resin that can be used include, for example, a bifunctional epoxy resin such as a bisphenol A epoxy resin and a novolac epoxy resin such as a phenol novolac epoxy resin and a cresol novolac epoxy resin. In addition, generally known resins such as a multifunctional epoxy resin, a glycidyl amine epoxy resin, a heterocycle-containing epoxy resin and an alicyclic epoxy resin can be used.

The bisphenol A epoxy resin includes Epikote 807, 815, 825, 827, 828, 834, 1001, 1004, 1007 and 1009 manufactured by Yuka Shell Epoxy Co., Ltd., DER-330, 301 and 361 manufactured by Dow Chemical Ltd., and YD8125 and YDF8170 manufactured by Tohto Kasei Co., Ltd. The phenol novolak epoxy resin includes Epikote 152 and 154 manufactured by Yuka Shell Epoxy Co., Ltd., EPPN-201 manufactured by Nippon Kayaku Co., Ltd., and DEN-438 manufactured by Dow Chemical Ltd., and the cresol novolak epoxy resin includes o-cresol novolak epoxy resins EOCN-102S, 103S, 104S, 1012, 1025 and 1027 manufactured by Nippon Kayaku Co., Ltd., YDCN701, 702, 703 and 704 manufactured by Tohto Kasei Co., Ltd. The multifunctional epoxy resin includes Epon 1031S manufactured by Yuka Shell Epoxy Co., Ltd., Araldite 0163 manufacture by Ciba Speciality Chemicals, and Denacoal EX-611, 614, 614B, 622, 512, 521, 421, 411 and 321 manufactured by Nagase Chemicals Ltd. The glycidyl amine epoxy resin includes Epikote 604 manufactured by Yuka Shell Epoxy Co., Ltd., YH-434 manufactured by Tohto Kasei Co., Ltd., TETRAD-X and TETRAD-C manufactured by Mitsubishi Gas Chemical Co., Inc., and ELM-120 manufactured by Sumitomo Chemical Co., Ltd. The heterocycle-containing epoxy resin includes Araldite PT810 manufactured by Ciba Speciality Chemicals and ERL4234, 4299, 4221 and 4206 manufactured by UCC. The alicyclic epoxy resin includes Epolead series and Ceroxide series manufactured by Daicel Chemical Industries, Ltd. These epoxy resins can used alone or as a mixture of two or more thereof.

The amount of the thermosetting component (a2) incorporated is preferably 15 to 95% by mass, more preferably 15 to 85% by mass, still preferably 20 to 80% by mass, most preferably 20 to 75% by mass, based on the total amount of the resin component (A). When the amount of the thermosetting component (a2) incorporated is lower than 15% by weight, the heat resistance and fluidity of the resulting resin layer tends to be decreased, while when the amount is higher than 95% by mass, the flexibility of the resulting resin layer tends to be decreased.

<Resin Component (A)>

In the present invention, the resin component (A) can contains not only the high-molecular-weight component (a1) and the thermosetting component (a2) but also the following resin components if necessary other than those described above. Examples of such usable resin components include a phenoxy resin, a polyamide resin, a polyamide imide resin or its precursor, and a polyimide resin or its precursor.

The resin component (A) preferably contains a known epoxy resin curing agent or a hardening accelerator as a catalyst for the thermosetting component (a2). The epoxy resin curing agent includes, for example, amines, a polyamide, an acid anhydride, a polysulfide, boron trifluoride, bisphenols having 2 or more phenolic hydroxyl groups in one molecule, such as bisphenol A, bisphenol F and bisphenol S, and phenol resins such as a phenol novolac resin, bisphenol A novolac resin and cresol novolac resin. Particularly, phenol resins such as a phenol novolac resin, bisphenol A novolac resin and cresol novolac resin are preferable from the viewpoint of excellent resistance to electrical corrosion at the time of moisture absorption. Preferable examples of such phenol resins include, for example, Pliophen LF2882, Pliophen LF2822, Pliophen LF4871, Pliophen TD-2090, Pliophen TD-2149, Pliophen VH-4150 and Pliophen VH4170 manufactured by Dainippon Ink And Chemicals, Incorporated.

The hardening accelerator that can be used includes those based on quaternary phosphonium salts, quaternary ammonium salts, imidazole, DBU fatty acid salts, metal chelates, metal salts and triphenyl phosphine.

<Filler (B)>

The filler (B) in the present invention is not particularly limited insofar as the average particle size thereof is within the range of 1 to 30 μm. The filler (B) is preferably an inorganic filler, and for example, crystalline silica, amorphous silica, aluminum oxide, titanium oxide, calcium carbonate, magnesium carbonate, aluminum nitride and boron nitride can be used.

The average particle size of the filler (B) is preferably within the range of 1 to 25 μm, more preferably 2 to 25 μm, still more preferably 2 to 20 μm. When the average particle size of the filler (B) is less than 1 μm, the fluidity of the resulting resin layer tends to be decreased to deteriorate the reliability of a semiconductor device, while when the average particle size is more than 30 μm, the resulting resin layer tends to have increased unevenness on the surface, thus decreasing its ability to be embedded.

The amount of the filler (B) incorporated is preferably 1 to 300 parts by mass, more preferably 5 to 300 parts by mass, still more preferably 5 to 250 parts by mass, most preferably 5 to 200 parts by mass, based on 10 parts by mass of the resin component (A). When the amount of the filler (B) incorporated is lower than 1 part by mass, the resulting sealing film tends to become softened to reduce the reliability of the resulting semiconductor device, while when the amount of the filler is higher than 300 parts by mass, the adhesiveness of the resulting sealing film and a semiconductor substrate tends to be decreased.

<Colorant (C)>

The colorant (C) in the present invention is not particularly limited, and for example, pigments such as carbon black, graphite, titanium carbon, manganese dioxide and phthalocyanine, or dyes can be used. In consideration of dispersibility and laser marking-property, non-white colorants such as carbon black are preferable.

The amount of the colorant (C) incorporated is preferably 0.01 to 10 parts by mass, more preferably 0.2 to 8 parts by mass, still more preferably 0.3 to 6 parts by mass, most preferably 0.5 to 5 parts by mass, based on 10 parts by mass of the resin component (A). When the amount of the colorant (C) used is lower than 0.01 part by mass, the resulting sealing film tends to be poor in coloration, to deteriorate visibility after laser marking, while when the amount of the colorant is higher than 10 parts by mass, the adhesiveness between the resulting sealing film and a semiconductor substrate tends to be decreased.

<Resin layer>

The resin layer of the present invention may contain additives such as a coupling agent if necessary in addition to the resin component (A), the filler (B) and the colorant (C). The coupling agent includes those based on silane, titanium and aluminum, among which a silane coupling agent is most preferable.

The silane coupling agent is not particularly limited, and examples of the silane coupling agent that can be used include vinyltrichlorosilane, vinyltris(β-methoxyethoxy) silane, vinyltriethoxysilane, vinyltrimethoxysilane, γ-methacryloxypropyltrimethoxysilane, γ-methacryloxypropylmethyldimethoxysilane, γ-(3,4-epoxycyclohexyl)ethyltrimethoxysilane, γ-glycidoxypropyltrimethoxysilane, γ-glycidoxypropylmethyldimethoxysilane, γ-glycidoxypropylmethyldiethoxysilane, N-β-(aminoethyl)-γ-aminopropyltrimethoxysilane, N-β (aminoethyl) γ-aminopropylmethyldimethoxysilane, γ-aminopropyltriethoxysilane, N-phenyl-γ-aminopropyltrimethoxysilane, γ-mercaptopropyltrimethoxysilane, γ-mercaptopropyltriethoxysilane, 3-aminopropylmethyldiethoxysilane, 3-ureidopropyltriethoxysilane, 3-ureidopropyltrimethoxysilane, 3-aminopropyltrimethoxysilane, 3-aminopropyl-tris(2-methoxy-ethoxy-ethoxy) silane, N-methyl-3-aminopropyltrimethoxysilane, triaminopropyl-trimethoxysilane, 3-4,5-dihydroimidazol-1-yl-propyltrimethoxysilane, 3-methacryloxypropyl-trimethoxysilane, 3-mercaptopropyl-methyldimethoxysilane, 3-chloropropyl-methyldimethoxysilane, 3-chloropropyl-dimethoxysilane, 3-cyanopropyl-triethoxysilane, hexamethyldisilazane, N,O-bis(trimethylsilyl)acetamide, methyltrimethoxysilane, methyltriethoxysilane, ethyltrichlorosilane, n-propyltrimethoxysilane, isobutyltrimethoxysilane, amyltrichlorosilane, octyltriethoxysilane, phenyltrimethoxysilane, phenyltriethoxysilane, methyltri(methacryloyloxyethoxy) silane, methyltri(glycidyloxy) silane, N-β (N-vinylbenzylaminoethyl)-γ-aminopropyltrimethoxysilane, octadecyldimethyl [3-(trimethoxysilyl)propyl]ammonium chloride, γ-chloropropylmethyldichlorosilane, γ-chloropropylmethyldimethoxysilane, γ-chloropropylmethyldiethoxysilane, trimethylsilyl isocyanate, dimethylsilyl isocyanate, methylsilyl triisocyanate, vinylsilyl triisocyanate, phenylsilyl triisocyanate, tetraisocyanate silane, ethoxysilane isocyanate etc., and these may be used alone or as a mixture of two or more thereof.

The titanium coupling agent is not particularly limited, and examples of the titanium coupling agent that can be used include isopropyltrioctanoyl titanate, isopropyldimethacrylisostearoyl titanate, isopropyltridecylbenzene sulfonyl titanate, isopropylisostearoyldiacryl titanate, isopropyltri(dioctylphosphate) titanate, isopropyltricumylphenyl titanate, isopropyltris(dioctylpyrophosphate) titanate, isopropyltris (n-aminoethyl) titanate, tetraisopropylbis(dioctylphosphite) titanate, tetraoctylbis(ditridecylphosphite) titanate, tetra(2,2-diallyloxymethyl-1-butyl)bis(ditridecyl)phosphite titanate, dicumylphenyloxy acetate titanate, bis(dioctylpyrophosphate)oxyacetate titanate, tetraisopropyl titanate, tetra-n-butyl titanate, butyl titanate dimer, tetra(2-ethylhexyl) titanate, titanium acetyl acetonate, polytitanium ethyl acetonate, titanium octylene glycolate, titanium lactate ammonium salt, titanium lactate, titanium lactate ethyl ester, titanium triethanol aminate, polyhydroxy titanium stearate, tetramethyl orthotitanate, tetraethyl orthotitanate, tetrapropyl orthotitanate, tetraisobutyl orthotitanate, stearyl titanate, cresyl titanate monomer, cresyl titanate polymer, diisopropoxy-bis(2,4-pentadionate) titanium(IV), diisopropyl-bis-triethanol aminotitanate, octylene glycol titanate, tetra-n-butoxy titanium polymer, tri-n-butoxy titanium monostearate polymer, and tri-n-butoxy titanium monostearate, and these coupling agents may be used alone or as a mixture of two or more thereof.

The aluminum-based coupling agent is not particularly limited, and examples of the aluminum-based coupling agent that can be used include aluminum chelate compounds such as ethylacetoacetate aluminum diisopropylate, aluminum tris (ethylacetoacetate), alkyl acetoacetate aluminum diisopropylate, aluminum monoacetylacetate bis(ethylacetoacetate), aluminum tris(acetylacetonate), aluminum-monoisopropoxy monooleoxyethyl acetoacetate, aluminum-di-n-butoxide-mono-ethyl acetoacetate, and aluminum-di-iso-propoxide-mono-ethyl acetoacetate, and aluminum alcolates such as aluminium isopropylate, mono-sec-butoxy aluminum diisopropylate, aluminum-sec-butylate and aluminum ethylate, and these coupling agents can be used alone or as a mixture of two or more thereof.

The additives such as the coupling agent are incorporated preferably in an amount of 50 parts by mass or less based on 100 parts by mass of the resin component (A) When the amount of the additives incorporated is higher than 50 parts by mass, the heat resistance of the resulting sealing film tends to be lowered.

In the present invention, the flow of the resin layer at 80° C. is within the range of 150 to 1800 μm, preferably 200 to 1600 μm, more preferably 400 to 1400 μm. When this flow is less than 150 μm, the adhesiveness between the resulting sealing film and a semiconductor substrate and the reliability of the resulting semiconductor device tends to be lowered, while when the flow is more than 1800 μm, the regulation of fluidity tends to be made difficult at the time of sealing a semiconductor element with the resulting sealing film, to lower workability.

The flow is a value determined by laminating the resin layer of 150 μm in thickness in a B-stage state on a substrate layer, then punching a 10×20 mm reed-shaped sample out from it, pressing the sample against a hot plate at 80° C. at a pressure of 0.2 MPa for 18 seconds with a thermocompression bonding test apparatus (manufactured by Tester Sangyo Co., Ltd.) and measuring the length of the resin having stuck out from the edge of the sample under an optical microscope.

This flow can be decreased by improving the degree of cure in a B-stage state, for example by increasing the amount of the filler (B) incorporated into the resin layer, by using a multifunctional epoxy resin as the thermosetting component (a2) to increase the crosslinking density of the resin layer, or by increasing heat history in film forming (specifically the condition of drying by heating to remove the solvent contained in a varnish for the resin layer).

The viscosity (film viscosity) at 50 to 100° C. of the resin layer in its B-stage state in the sealing film of the present invention in thermosetting viscoelasticity measurement is within the range of 10000 to 100000 Pa·s, preferably 10000 to 95000, more preferably 10000 to 90000, still more preferably 15000 to 90000. When the viscosity at 50 to 100° C. is lower than 10000 Pa·s, the sealing film tends to become soft, to lower the reliability of the resulting semiconductor device, while when the viscosity is higher 100000 Pa·s, the adhesiveness between the resulting sealing film and a semiconductor substrate tends to be decreased.

The film viscosity can be measured by punching only the resin layer (film thickness 150 µm) out from the sealing film and measuring the resulting disk-shaped resin layer sample of 8 mm in diameter with a viscosity/viscoelasticity measuring instrument (RheoStress RS 600 manufactured by Thermo Haake) in a constant-strain mode at a frequency of 1 Hz with an applied strain of 1% at a heating rate of 5° C./min.

This film viscosity can be decreased by improving the degree of cure in a B-stage state, for example by increasing the amount of the filler (B) incorporated into the resin layer, by using a filler excellent in fluidity as the filler (B), by using a multifunctional epoxy resin as the thermosetting component (a2) to increase the crosslinking density of the resin layer, or by increasing heat history in film forming (specifically the condition of drying by heating to remove the solvent contained in a varnish for the resin layer).

As the filler excellent in fluidity, a spherical filler may be used.

In the present invention, the storage elastic modulus of the resin layer after cured at 170° C. for 1 hour, as determined at 35° C. with a dynamic viscoelasticity measuring instrument, is within the range of preferably 100 to 20000 MPa, more preferably 100 to 19000 MPa, still more preferably 200 to 18000 MPa, further more preferably 500 to 16000 MPa. When the storage elastic modulus is lower than 500 MPa, the adhesiveness between the resulting sealing film and a sealing element may be lowered, while when the storage elastic modulus is higher than 20000 MPa, the reliability of the resulting semiconductor device may be lowered.

The storage elastic modulus is a value determined by measuring the resin layer of 150 µm in thickness in a B-stage state under the conditions of 35° C. and 10 Hz with a dynamic viscoelasticity spectrometer (DVE-4) manufactured by Rheology Co., Ltd.

This storage elastic modulus can be increased by improving the degree of cure in a B-stage state, for example by increasing the amount of the filler (B), by using a filler excellent in fluidity, by using a multifunctional epoxy resin as the thermosetting component (a2) to increase the crosslinking density of the resin layer, or by increasing heat history in film forming.

<Sealing Film of the Present Invention>

As shown in FIG. 1, the sealing film of the present invention may comprise a substrate layer 1 on one side of the resin layer 2. When the resin layer comprise the substrate layer, the thickness of the resin layer is preferably 5 µm or more, more preferably 10 µm or more, still more preferably 20 µm or more, most preferably 30 µm or more. The thickness of the resin layer is preferably 800 µm or less, more preferably 600 µm or less, still more preferably 500 µm or less, most preferably 400 µm or less. When the thickness of the resin layer is less than 5 µm, the adhesiveness of the resin layer to a semiconductor element may be lowered, while when the thickness is more than 800 µm, the thickness of the resulting semiconductor element may be increased to hinder package designing.

The thickness of the substrate layer is preferably within the range of 5 to 300 µm, more preferably 5 to 200 µm, still more preferably 5 to 100 µm, most preferably 10 to 100 µm. When the thickness of the substrate layer is less than 5 µm, it may be impossible to prepare the film itself due to insufficient strength at the time of manufacturing the film, while when the thickness of the film is more than 300 µm, there is no particular advantage, and the film itself may become expensive.

The material that can be used as the substrate layer is not particularly limited, and the material that can be used includes plastic films such as polytetrafluoroethylene film, polyethylene terephthalate film, polyethylene film, polypropylene film, polymethylpentene film, polyethylene naphthalate film, polyether sulfone film, polyether amide film, polyetheramide imide film, polyamide film, polyamide imide film, and polyimide film. If necessary, surface treatments such as primer coating, UV treatment, corona discharge treatment, polishing, etching, and release treatment may be conducted.

Figure 2:
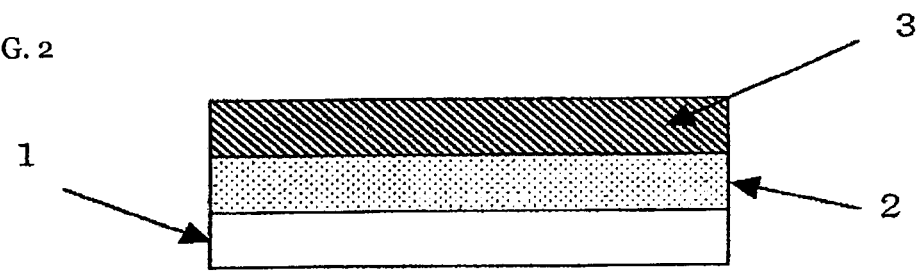
FIG. 2 is a schematic view of a sealing film comprising a substrate layer 1, a resin layer 2 and a protective layer 3.

As shown in FIG. 2, the sealing film of the present invention may comprise the substrate layer 1 on one side of the resin layer 2 and the protective layer 3 on the other side.

The sealing film of the present invention may comprise the protective layer on one side of the resin layer, and the thickness of the protective layer is preferably within the range of 5 to 300 µm, more preferably 5 to 200 µm, still more preferably 5 to 100 µm, most preferably 10 to 100 µm. When the thickness of the protective layer is less than 5 µm, it may be impossible to protect the film sufficiently, while when the thickness of the film is more than 300 µm, there is no particular advantage, and the film itself may become expensive.

The material used as the protective layer is not particularly limited, and examples of the material that can be used include plastic films such as polytetrafluoroethylene film, polyethylene terephthalate film, polyethylene film, polypropylene film, polymethylpentene film, polyethylene naphthalate film, polyether sulfone film, polyether amide film, polyetheramide imide film, polyamide film, polyamide imide film, and polyimide film. If necessary, surface treatments such as primer coating, UV treatment, corona discharge treatment, polishing, etching, and release treatment may be conducted.

<Production of the Sealing Film>

Hereinafter, the sealing film of the present invention is described in detail.

The sealing film of the present invention can be prepared as follows. For example, a solvent is added to a resin layer component containing at least the resin component (A), the filler (B) and the colorant (C) to prepare a varnish. When the sealing film comprises a substrate layer, the varnish is applied onto the substrate layer, or when the sealing film is composed of a resin layer only, the varnish is applied onto a mold or the like, and then the solvent is removed by drying under heating to form a resin layer in a B-stage state thereby preparing the sealing film of the invention.

In the present invention, the solvent used in the varnish for the resin layer is not particularly limited, and examples of such solvent include ether solvents such as diethylene glycol dimethyl ether, diethylene glycol diethyl ether, triethylene glycol dimethyl ether, and triethylene glycol diethyl ether; sulfur-containing solvents such as dimethyl sulfoxide, diethyl sulfoxide, dimethyl sulfone and sulfolane; ester solvents such as γ-butyrolactone and cellosolve acetate; ketone solvents such as cyclohexanone and methyl ethyl ketone; nitrogen-containing solvents such as N-methyl pyrrolidone, dimethyl acetamide and 1,3-dimethyl-3,4,5,6-tetrahydro-2(1H)-pyrimidinone; and aromatic hydrocarbon solvents such as toluene and xylene. These solvents can be used alone or as a mixture of two or more thereof.

The conditions for drying by heating vary depending on the component of the resin layer and the type of the solvent, but generally, the varnish is heated at a temperature within the range of 60 to 200° C. for 3 to 30 minutes. The conditions for drying by heating influence the "flow" and "film viscosity" of the sealing film of the present invention, and therefore, when the flow or film viscosity is too low, the sealing film should be suitably prepared by increasing heat history, for example by increasing the temperature for drying by heating, by increasing the time of drying by heating, or by increasing the frequency of drying by heating.

The method of applying the varnish is not particularly limited, but in consideration of workability, the varnish is applied preferably by using a multi-coater.

<Semiconductor Device Using the Sealing Film of the Present Invention>

The semiconductor device of the present invention is characterized in that it is produced by using the sealing film of the present invention. Hereinafter, its manufacturing examples and forms are described in detail by reference to the Figures, but the present invention is not limited to the following description.

Figure 3:
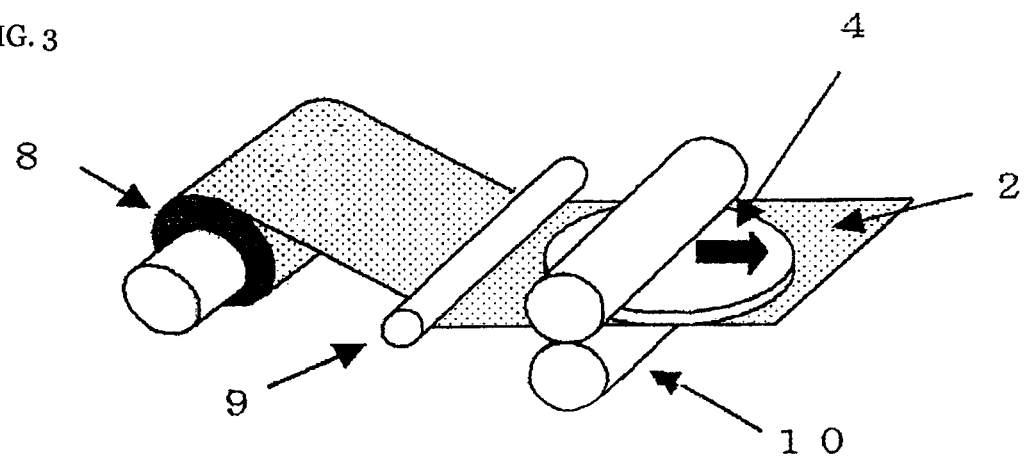
FIG. 3 is a schematic view of a step of laminating a sealing film on a semiconductor substrate.

FIG. 3 is a schematic view showing a step of sealing electrodes on a semiconductor substrate with the sealing film (resin layer) of the present invention in the form of a rolled sealing film 8. When the sealing film of the present invention comprising the constitution shown in FIG. 1 is used, the resin layer 2 is contacted with the electrode surface of the semiconductor substrate 4, or when the sealing film of the present invention comprising the constitution shown in FIG. 2 is used, the protective layer 3 is removed, then the tension of the film is made uniform on the roll 9, and the sealing film is laminated by a lamination roll 10 such that the resin layer 2 is contacted with the electrode surface of the semiconductor substrate 4, whereby the electrodes on the semiconductor substrate are sealed. The laminating temperature in the laminating step is preferably 180° C. or less, more preferably 140° C. or less, still more preferably 120° C. or less, from the viewpoint of applying no loading on the semiconductor substrate and being excellent workability. The sealing film of the present invention is particularly preferable for the case that the electrodes are protruded electrodes.

The method for sealing by using the sealing film of the present invention is not limited to the method by film lamination as described above, and can be a method by thermocompression bonding or by vacuum compression bonding the sealing film to a semiconductor substrate or a method by directly bonding the sealing film to a semiconductor element by heat pressing. The compression bonding conditions etc. vary depending on the type of the sealing film used in sealing and on the shape of a semiconductor substrate or element.

Figure 4:
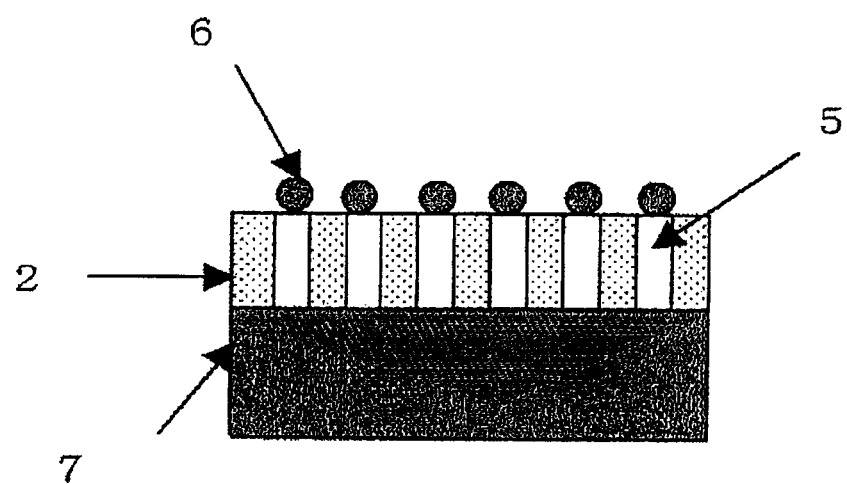
FIG. 4 is a schematic view of a semiconductor element having protruded electrodes sealed with a sealing film.

FIG. 4 is a schematic view of a semiconductor element 7 comprising protruded electrodes sealed with the sealing film (resin layer) of the present invention. Such semiconductor element can be obtained by sealing protruded electrodes 5 of a semiconductor substrate as shown in FIG. 3 followed by, for example, a step of releasing the substrate layer from the sealing film, a step of curing the resin layer 2 by heating, a step of mounting solder balls 6 on the protruded electrodes 5, a step of laminating a dicing tape on the opposite side of the semiconductor substrate to the side thereof sealed with the resin layer, a step of dicing the semiconductor substrate in predetermined size, and a step of releasing the dicing tape from the semiconductor substrate comprising the protruded electrodes 5. By mounting the resulting semiconductor element on a predetermined position of a circuit substrate, a semiconductor device can be obtained.

The semiconductor substrate 4 comprising the protruded electrodes is not particularly limited and includes, for example, silicon wafers etc. After a semiconductor element is prepared by the above-mentioned method, the semiconductor element can display discrimination information for discriminating the product by irradiating its sealing film with a YAG laser etc.

The semiconductor element obtained by sealing with the sealing film of the present invention is excellent in reliability etc. and can thus be used in various semiconductor devices, and can also be used in sealing various devices such as SAW devices and various sensors.

EXAMPLES

Hereinafter, the present invention is described in more detail by reference to the Examples, but the present invention is not limited thereto.

Example 1

Preparation of a Sealing Film

Cyclohexanone was added to a composition consisting of 12.4 parts by mass of an epoxy group-comprising acrylic rubber (trade name: HHTR-860P-3DR, with a weight-average molecular weight of 800,000 and a Tg of −7° C., manufactured by Nagase ChemteX Corporation) as the high-molecular-weight component (a1), 33.6 parts by mass of a bisphenol F epoxy resin (trade name: YD-8170C, with an epoxy equivalent of 160, manufactured by Tohto Kasei Co., Ltd.) and 33.8 parts by mass of a phenol/p-xylylene glycol dimethyl ether copolymer resin (trade name: Mirex XLC-LL, with a hydroxyl equivalent of 174, manufactured by Mitsui Chemicals, Inc.) as the thermosetting component (a2), 0.1 part by mass of 1-cyano-1-phenyl imidazole (trade name: Curezole 2PZ-CN, manufactured by Shikoku Chemicals Corporation), 356.24 parts by mass of a silica filler (trade name: TFC-24, with an average particle size of about 8 μm, manufactured by Tatumori Ltd.) as the filler (B), 8.3 parts by mass of a resin processed pigment (trade name: FP BLACK 308, with a carbon black content of 29.0 mass %, manufactured by Sanyo Color Works, Ltd.) as the colorant (C) and 1.0 part by mass of γ-glycidoxypropyltrimethoxy silane (trade name: SH6040, manufactured by Dow Corning Toray Co, Ltd.) as the coupling agent. Then, the mixture was mixed under stirring and then vacuum-degassed to give a varnish with about 60 mass % nonvolatile content (abbreviated hereinafter as NV). Measurement and calculation of NV are as follows:

NV (mass %)=(amount (g) of the varnish after drying by heating/amount (g) of the varnish before drying by heating)×100

*Drying conditions: 170° C., 1 hour

The varnish obtained above was applied onto a substrate layer (trade name: Purex A31B, a release agent-treated polyethylene terephthalate film with a film thickness of 38 μm, manufactured by Teijin DuPont Films Japan Limited) and then dried by heating at 90° C. for 5 minutes and then at 140° C. for 5 minutes to form a coating film consisting of a resin layer of 150 μm in thickness after drying by heating, whereby a sealing film A in a B-stage state was obtained.

<Evaluation of a Sealing Film (Resin Layer)>

The sealing film A (resin layer) obtained above was evaluated for its flow, film viscosity, modulus of elongation, Tg, thermal decomposition onset point, embedding property, and laser marking visibility, as shown below. The results are collectively shown in Table 1.

Flow

A 10×20 mm reed-shaped sample was punched out from the sealing film A obtained above, and then the sample comprising the sealing film laminated on the substrate layer was pressed against a hot plate at 80° C. at a pressure of 0.2 MPa for 18 seconds with a thermocompression bonding apparatus (manufactured by Tester Sangyo Co., Ltd.), and then the length of the resin having stuck out from the edge of the sample was measured as flow under an optical microscope.

Film Viscosity

The varnish obtained above was applied onto a substrate layer (trade name: Purex A31, a release agent-treated polyethylene terephthalate film with a film thickness of 38 μm, manufactured by Teijin DuPont Films Japan Limited) and then dried by heating at 90° C. for 5 minutes and then at 140° C. for 5 minutes to form a coating film consisting of a resin layer of 150 μm in thickness after drying by heating, whereby a film A in a B-stage state was obtained. The resin layer only (film thickness 150 μm) of the resulting film A was punched out in the form of a disk of 8 mm in diameter and then measured for its film viscosity at a temperature of from 50° C. to 100° C. at a heating rate of 5° C./min. in a constant-strain mode at a frequency of 1 Hz with an applied strain of 1% with a viscosity/viscoelasticity measuring instrument (RheoStress RS 600 manufactured by Thermo Haake). Table 1 shows film viscosity at 50° C. and film viscosity at 100° C.

Storage Elastic Modulus and Tg

The sealing film A obtained above was cured at 170° C. for 1 hour, and the part of the resin layer was measured for its storage elastic modulus (35° C., 10 Hz) and glass transition temperature (frequency 10 Hz, heating rate 2° C./min) with a dynamic viscoelasticity spectrometer (DVE-4, manufactured by Rheology Co., Ltd.)

Thermal Decomposition Onset Point

The resin layer of the sealing film A was measured for its thermal decomposition onset point at a heating rate of 10° C./min. in an air atmosphere with a differential thermal balance (SSC5200, manufactured by Seiko Instruments Inc.)

Embedding Property

The sealing film A obtained above was laminated on a semiconductor substrate having wiring and copper posts formed thereon (pitch dimensions: 5.3 mm×6.3 mm, scribe line: 100 μm, copper post diameter: 300 μm, copper post height: 100 μm), by a hot roll laminator (trade name: VA-400III, manufactured by Taisei Laminator Co., Ltd.) (laminating conditions: 80° C., 0.2 MPa, 0.5 m/min). After lamination, the semiconductor substrate on which the sealing film A had been laminated was cut at the part of the copper posts, and then its section was measured with an optical microscope, to evaluate the ability of the sealing film to be embedded under the following criteria (samples evaluated as ○ and Δ are acceptable).

○: No generation of voids due to insufficient embedding
Δ: Slight generation of voids due to insufficient embedding (degree of generation of voids: less than 10% of the total number of copper posts)
X: Certain generation of voids due to insufficient embedding (degree of generation of voids: 10 to 50% of the total number of copper posts)
XX: Almost entire generation of voids due to insufficient embedding (degree of generation of voids: more than 50% of the total number of copper posts)

Laser Marking Visibility

The sealing film A obtained above was laminated on a mirror surface of a silicon wafer of 300 μm in thickness by a hot roll laminator (trade name: VA-400III, manufactured by Taisei Laminator Co., Ltd.) (laminating conditions: 80° C., 0.2 MPa, 0.5 m/min) to give the silicon wafer provided with the sealing film, then the substrate layer was released, and the silicon wafer provided with the resin layer was cured at 170° C. for 1 hour and then subjected at the side of the resin layer to laser marking with a YAG laser with an output power of 5.0 J/pulse, and its visibility was confirmed (number of samples: 100).

The method for evaluating visibility involves incorporating an image by scanning the surface after marked with the laser and then displaying a marked part and its surrounding unmarked part in two tones by image processing software (trade name: PHOTSHOP manufactured by Adobe). By this operation, the laser-marked surface is divided into 256 monochromatic levels depending on luminosity. Then, "the threshold of a border at which the marked and unmarked parts are displayed in 2 tones" wherein the marked part is displayed in white and the unmarked part is displayed in black, and "the threshold of a border at which the marked and unmarked parts are displayed in 2 tones" wherein the marked part is also displayed in black so the border between the marked and the unmarked parts disappears, were determined, and when the difference between the two thresholds was 40 or more, the sealing film was judged to be excellent in visibility (evaluation: ○); when the difference between the two thresholds was 30 or more to less than 40, the sealing film was judged to be almost excellent in visibility (evaluation: Δ); and when the difference between the two thresholds was less than 30, the sealing film was judged to be poor in visibility (evaluation: X). The numbers of samples corresponding to the evaluations ○, Δ and X respectively are shown in Table 1.

<Preparation and Evaluation of a Semiconductor Device>

The sealing film A obtained above was laminated on a semiconductor substrate having wiring and copper posts formed thereon (pitch dimensions: 5.3 mm×6.3 mm, scribe line: 100 μm, copper post diameter: 300 μm, copper post height: 100 μm), by a hot roll laminator (trade name: VA-400III, manufactured by Taisei Laminator Co., Ltd.) (laminating conditions: 80° C., 0.2 MPa, 0.5 m/min) and then the substrate layer was released, followed by a step of curing the resin layer at 170° C. for 1 hour, a step of grinding the resin layer to expose the copper posts to the surface, a step of forming relay terminals on the copper posts, a step of dicing it, and a step of picking up the resulting semiconductor element and mounting it on an organic substrate, whereby a semiconductor device was prepared.

Then, this semiconductor device was subjected to 1000 cycles in a heat cycle test (number of samples: 10), each cycle consisting of −55° C./30 min.⇆125° C./30 min., to examine whether the resin layer had cracked or not. The results are shown in Table 1. Table 1 shows (number of semiconductor devices having a cracked resin layer)/(total number of samples).

Example 2

Preparation of a Sealing Film

A sealing film B in a B-stage state was obtained in the same manner as in Example 1 except that the dry conditions of the varnish applied on a substrate layer were 90° C. for 10 minutes and 140° C. for 10 minutes instead of 90° C. for 5 minutes and 140° C. for 5 minutes.

<Evaluation of the Sealing Film (Resin Layer)>

The sealing film B obtained above was evaluated in the same manner as in Example 1. The results are collectively shown in Table 1.

<Preparation and Evaluation of a Semiconductor Device>

A semiconductor device was prepared and evaluated in the same manner as in Example 1 except that the sealing film B obtained above was used in place of the sealing film A. The results are shown in Table 1.

Example 3

Preparation of a Sealing Film

A sealing film C in a B-stage state was obtained in the same manner as in Example 1 except that the dry conditions of the varnish applied on a substrate layer were 90° C. for 7 minutes and 140° C. for 7 minutes instead of 90° C. for 5 minutes and 140° C. for 5 minutes.

<Evaluation of the Sealing Film (Resin Layer)>

The sealing film C obtained above was evaluated in the same manner as in Example 1. The results are collectively shown in Table 1.

<Preparation and Evaluation of a Semiconductor Device>

A semiconductor device was prepared and evaluated in the same manner as in Example 1 except that the sealing film C obtained above was used in place of the sealing film A. The results are shown in Table 1.

Example 4

Preparation of a Sealing Film

A sealing film D in a B-stage state was obtained in the same manner as in Example 1 except that the dry conditions of the varnish applied on a substrate layer were 90° C. for 3 minutes and 140° C. for 3 minutes instead of 90° C. for 5 minutes and 140° C. for 5 minutes.

<Evaluation of the Sealing Film (Resin Layer)>

The sealing film D obtained above was evaluated in the same manner as in Example 1. The results are collectively shown in Table 1.

<Preparation and Evaluation of a Semiconductor Device>

A semiconductor device was prepared and evaluated in the same manner as in Example 1 except that the sealing film D obtained above was used in place of the sealing film A. The results are shown in Table 1.

Example 5

Preparation of a Sealing Film

Cyclohexanone was added to a composition consisting of 12.4 parts by mass of an epoxy group-comprising acrylic rubber (trade name: HHTR-860P-3DR, with a weight-average molecular weight of 800,000 and a Tg of −7° C., manufactured by Nagase ChemteX Corporation) as the high-molecular-weight component (a1), 33.6 parts by mass of a bisphenol F epoxy resin (trade name: YD-8170C, with an epoxy equivalent of 160, manufactured by Tohto Kasei Co., Ltd.) and 33.8 parts by mass of a phenol/p-xylylene glycol dimethyl ether copolymer resin (trade name: Mirex XLC-LL, with a hydroxyl equivalent of 174, manufactured by Mitsui Chemicals, Inc.) as the thermosetting component (a2), 0.1 part by mass of 1-cyano-1-phenyl imidazole (trade name: Curezole 2PZ-CN, manufactured by Shikoku Chemicals Corporation) 152.6 parts by mass of a silica filler (trade name: TFC-24, with an average particle size of about 8 μm, manufactured by Tatumori Ltd.) as the filler (B), 8.55 parts by mass of a resin processed pigment (trade name: FP BLACK 308, with a carbon black content of 29.0 mass %, manufactured by Sanyo Color Works, Ltd.) as the colorant (C) and 1.0 part by mass of γ-glycidoxypropyltrimethoxy silane (trade name: SH6040, manufactured by Dow Corning Toray Co., Ltd.) as the coupling agent. Then, the mixture was mixed under stirring and then vacuum-degassed to give a varnish with about 60 mass % NV.

The varnish obtained above was applied onto a substrate layer (trade name: Purex A31B, a release agent-treated polyethylene terephthalate film with a film thickness of 38 μm, manufactured by Teijin DuPont Films Japan Limited) and then dried by heating at 90° C. for 10 minutes and then at 140° C. for 10 minutes to form a coating film consisting of a resin layer of 150 μm in thickness after drying by heating, whereby a sealing film E in a B-stage state was obtained.

<Evaluation of the Sealing Film (Resin Layer)>

The sealing film E obtained above was evaluated in the same manner as in Example 1. The results are collectively shown in Table 1.

<Preparation and Evaluation of a Semiconductor Device>

A semiconductor device was prepared and evaluated in the same manner as in Example 1 except that the sealing film E obtained above was used in place of the sealing film A. The results are shown in Table 1.

TABLE 1

| | | | | Example 1 | Example 2 | Example 3 | Example 4 | Example 5 |
|---|---|---|---|---|---|---|---|---|
| Compsition | a1 | | HTR860*1 | 12.4 | 12.4 | 12.4 | 12.4 | 12.4 |
| | a2 | | YD8170C*2 | 33.6 | 33.6 | 33.6 | 33.6 | 33.6 |
| | | | XLC-LL*3 | 33.8 | 33.8 | 33.8 | 33.8 | 33.8 |
| | | | YDCN703*4 | 0 | 0 | 0 | 0 | 0 |
| | | | LF4871*5 | 0 | 0 | 0 | 0 | 0 |
| | B | | TFC-24*6 | 356.24 | 356.24 | 356.24 | 356.24 | 152.6 |
| | | | TFC-12*7 | 0 | 0 | 0 | 0 | 0 |
| | | | FB-35*8 | 0 | 0 | 0 | 0 | 0 |
| | | | SO-C2*9 | 0 | 0 | 0 | 0 | 0 |
| | C | | FP308*10 | 8.3 | 8.3 | 8.3 | 8.3 | 8.55 |
| | Others | | 2PZ-CN*11 | 0.1 | 0.1 | 0.1 | 0.1 | 0.1 |
| | | | SH6040*12 | 1 | 1 | 1 | 1 | 1 |
| | | | A189*13 | 0 | 0 | 0 | 0 | 0 |
| | | | A1160*14 | 0 | 0 | 0 | 0 | 0 |
| Film making conditions (Temp. (° C.)/Time(min)) | | | 1 bath | 90/5 | 90/10 | 90/7 | 90/3 | 90/10 |
| | | | 2 bath | 140/5 | 140/10 | 140/7 | 140/3 | 140/10 |
| a1/(a1 + a2) | 5~85 | | | 15.54 | 15.54 | 15.54 | 15.54 | 15.54 |
| A | 10 | | | 10 | 10 | 10 | 10 | 10 |

TABLE 1-continued

|   |   |   | Example 1 | Example 2 | Example 3 | Example 4 | Example 5 |
|---|---|---|---|---|---|---|---|
| B | 5~300 | | 44.64 | 44.64 | 44.64 | 44.64 | 19.12 |
| C | 0.01~10 | | 1.04 | 1.04 | 1.04 | 1.04 | 1.07 |
| B-stage film | | | A | B | C | D | E |
| Film characteristics | Flow (μm) | | 1,000 | 240 | 550 | 1550 | 1,000 |
| | Film viscosity (Pa · s) | (50° C.) | 80,000 | 30,000 | 40,000 | 95,000 | 80,000 |
| | | (100° C.) | 20,000 | 12,000 | 20,000 | 40,000 | 20,000 |
| | Strage elastic modulus (35° C., MPa) | | 11,000 | 11,000 | 11,000 | 11,000 | 7,000 |
| | Tg (° C.) | | 160 | 160 | 160 | 160 | 160 |
| | Thermal decomposition onset point (° C.) | | 350 | 350 | 350 | 350 | 350 |
| | Embedding property | | ○ | Δ | ○ | ○ | Δ |
| | Laser marking visibility | ○ | 100 | 100 | 100 | 100 | 100 |
| | | Δ | 0 | 0 | 0 | 0 | 0 |
| | | x | 0 | 0 | 0 | 0 | 0 |
| Evaluation of semiconductor device | | | 0/10 | 1/10 | 0/10 | 1/10 | 2/10 |

*1: Epoxy group-comprising acrylic rubber (weight-average molecular weight: 800,000, Tg: −7° C.)
*2: Bisphenol F epoxy resin (epoxy equivalent 160)
*3: Phenol/p-xylylene glycol dimethyl ether copolymer resin (hydroxyl equivalent 174)
*4: Cresol novolac epoxy resin (epoxy equivalent 210)
*5: Phenol novolac resin
*6: Silica filler (average particle size about 8 μm)
*7: Silica filler (average particle size about 4 μm)
*8: Silica filler (average particle size about 10 μm)
*9: Silica filler (average particle size about 0.5 μm)
*10: Resin-based processed pigment (carbon black content 29.0 mass %)
*11: 1-Cyano-1-phenyl imidazole
*12: γ-Glycidoxypropyltrimethoxy silane
*13: γ-Mercaptopropyltrimethoxy silane
*14: γ-Ureidopropyltrimethoxy silane Comparative Example 1

Preparation of a Sealing Film

Cyclohexanone was added to a composition consisting of 12.4 parts by mass of an epoxy group-comprising acrylic rubber (trade name: HHTR-860P-3DR, with a weight-average molecular weight of 800,000 and a Tg of −7° C., manufactured by Nagase ChemteX Corporation) as the high-molecular-weight component (a1), 33.6 parts by mass of a bisphenol F epoxy resin (trade name: YD-8170C, with an epoxy equivalent of 160, manufactured by Tohto Kasei Co., Ltd.) and 33.8 parts by mass of a phenol/p-xylylene glycol dimethyl ether copolymer resin (trade name: Mirex XLC-LL, with a hydroxyl equivalent of 174, manufactured by Mitsui Chemicals, Inc.) as the thermosetting component (a2), 0.1 part by mass of 1-cyano-1-phenyl imidazole (trade name: Curezole 2PZ-CN, manufactured by Shikoku Chemicals Corporation), 8.3 parts by mass of a resin-based processed pigment (trade name: FP BLACK 308, with a carbon black content of 29.0 mass %, manufactured by Sanyo Color Works, Ltd.) as the colorant (C) and 1.0 part by mass of γ-glycidoxypropyltrimethoxy silane (trade name: SH6040, manufactured by Dow Corning Toray Co., Ltd.) as the coupling agent. Then, the mixture was mixed under stirring and then vacuum-degassed to give a varnish with about 60 mass % NV.

The varnish obtained above was applied onto a substrate layer (trade name: Purex A31B, a release agent-treated polyethylene terephthalate film with a film thickness of 38 μm, manufactured by Teijin DuPont Films Japan Limited) and then dried by heating at 90° C. for 20 minutes and then at 140° C. for 20 minutes to form a coating film consisting of a resin layer of 150 μm in thickness after drying by heating, whereby a sealing film F in a B-stage state was obtained.

<Evaluation of the Sealing Film (Resin Layer)>

The sealing film F obtained above was evaluated in the same manner as in Example 1. The results are collectively shown in Table 2.

<Preparation and Evaluation of a Semiconductor Device>

A semiconductor device was prepared and evaluated in the same manner as in Example 1 except that the sealing film F obtained above was used in place of the sealing film A. The results are shown in Table 2.

Comparative Example 2

Preparation of a Sealing Film

A sealing film G in a B-stage state was obtained in the same manner as in Comparative Example 1 except that the dry conditions of the varnish applied on a substrate layer were 90° C. for 15 minutes and 140° C. for 15 minutes instead of 90° C. for 20 minutes and 140° C. for 20 minutes.

<Evaluation of the Sealing Film (Resin Layer)>

The sealing film G obtained above was evaluated in the same manner as in Example 1. The results are collectively shown in Table 2.

<Preparation and Evaluation of a Semiconductor Device>

A semiconductor device was prepared and evaluated in the same manner as in Example 1 except that the sealing film G obtained above was used in place of the sealing film A. The results are shown in Table 2.

Comparative Example 3

Preparation of a Sealing Film

A sealing film H in a B-stage state was obtained in the same manner as in Comparative Example 1 except that the dry conditions of the varnish applied on a substrate layer were 90° C. for 3 minutes and 115° C. for 3 minutes instead of 90° C. for 20 minutes and 140° C. for 20 minutes.

<Evaluation of the Sealing Film (Resin Layer)>

The sealing film H obtained above was evaluated in the same manner as in Example 1. The results are collectively shown in Table 2.

<Preparation and Evaluation of a Semiconductor Device>

A semiconductor device was prepared and evaluated in the same manner as in Example 1 except that the sealing film H obtained above was used in place of the sealing film A. The results are shown in Table 2.

152.6 parts by mass of a silica filler (trade name: TFC-12, with an average particle size of about 4 μm, manufactured by Tatumori Ltd.) as the filler (B), and 2.5 parts by mass of a resin processed pigment (trade name: FP BLACK J308, with a carbon black content of 29.0 mass %, manufactured by Sanyo Color Works, Ltd.) as the colorant (C). Then, the mixture was mixed under stirring and then vacuum-degassed to give a varnish with about 60 mass % nonvolatile content (abbreviated hereinafter as NV).

TABLE 2

| | | | Comparative Example 1 | Comparative Example 2 | Comparative Example 3 |
|---|---|---|---|---|---|
| Compsition | a1 | HTR860*1 | 12.4 | 12.4 | 12.4 |
| | a2 | YD8170C*2 | 33.6 | 33.6 | 33.6 |
| | | XLC-LL*3 | 33.8 | 33.8 | 33.8 |
| | | YDCN703*4 | 0 | 0 | 0 |
| | | LF4871*5 | 0 | 0 | 0 |
| | B | TFC-24*6 | 0 | 0 | 0 |
| | | TFC-12*7 | 0 | 0 | 0 |
| | | FB-35*8 | 0 | 0 | 0 |
| | | SO-C2*9 | 0 | 0 | 0 |
| | C | FP308*10 | 8.3 | 8.3 | 8.3 |
| | Others | 2PZ-CN*11 | 0.1 | 0.1 | 0.1 |
| | | SH6040*12 | 1 | 1 | 1 |
| | | A189*13 | 0 | 0 | 0 |
| | | A1160*14 | 0 | 0 | 0 |
| Film making conditions (Temp. (° C.)/Time(min)) | | 1 bath | 90/5 | 90/15 | 90/3 |
| | | 2 bath | 140/5 | 140/15 | 115/3 |
| a1/(a1 + a2) | 5~85 | | 15.54 | 15.54 | 15.54 |
| A | 10 | | 10 | 10 | 10 |
| B | 5~300 | | 0 | 0 | 0 |
| C | 0.01~10 | | 1.04 | 1.04 | 1.04 |
| B-stage film | | | F | G | H |
| Film characteristics | Flow (μm) | | 1,400 | 110 | 1,900 |
| | Film viscosity (Pa·s) | (50° C.) | 40,000 | 150,000 | 170,000 |
| | | (100° C.) | 9,000 | 20,000 | 20,000 |
| | Strage elastic modulus (35° C., MPa) | | 90 | 11,000 | 11,000 |
| | Tg (° C.) | | 160 | 160 | 160 |
| | Thermal decomposition onset point (° C.) | | 50 | 350 | 350 |
| | Embedding property | | ○ | xx | x |
| | Laser marking visibility | ○ | 45 | 100 | 100 |
| | | Δ | 55 | 0 | 0 |
| | | x | 0 | 0 | 0 |
| Evaluation of semiconductor device | | | 10/10 | 10/10 | 7/10 |

*1 to 14: The same as in Table 1.

As can be seen from Table 1, the sealing films in Examples 1 to 5 are excellent in all of embedding property, adhesiveness to a semiconductor substrate and laser marking visibility.

Example 6

Preparation of a Sealing Film

Cyclohexanone was added to a composition consisting of 33.4 parts by mass of an epoxy group-comprising acrylic rubber (trade name: HTR-860P-3DR, with a weight-average molecular weight of 800,000 and a Tg of −7° C., manufactured by Nagase ChemteX Corporation) as the high-molecular-weight component (a1), 33.6 parts by mass of a bisphenol F epoxy resin (trade name: YD-8170C, with an epoxy equivalent of 160, manufactured by Tohto Kasei Co., Ltd.) and 33.8 parts by mass of a phenol/p-xylylene glycol dimethyl ether copolymer resin (trade name: Mirex XLC-LL, with a hydroxyl equivalent of 174, manufactured by Mitsui Chemicals, Inc.), as the thermosetting component (a2), 0.5 part by mass of 1-cyano-1-phenyl imidazole (trade name: Curezole 2PZ-CN, manufactured by Shikoku Chemicals Corporation)

The varnish obtained above was applied onto a substrate layer (trade name: Purex A31B, a release agent-treated polyethylene terephthalate film with a film thickness of 38 μm, manufactured by Teijin DuPont Films Japan Limited) and then dried by heating at 90° C. for 5 minutes and then at 140° C. for 5 minutes to form a coating film of 188 μm in thickness, whereby a film I in a B-stage state (thickness of the resin layer: 150 μm) was obtained.

<Evaluation of the Sealing Film (Resin Layer)>

The sealing film I obtained above was evaluated in the same manner as in Example 1. The results are collectively shown in Table 3.

<Preparation and Evaluation of a Semiconductor Device>

A semiconductor device was prepared and evaluated in the same manner as in Example 1 except that the sealing film I obtained above was used in place of the sealing film A. The results are shown in Table 3.

Example 7

Preparation of a Sealing Film

A film J in a B-stage state (thickness of the resin layer: 150 μm) was obtained in the same manner as in Example 6 except that 152.6 parts by mass of a silica filler (trade name: TFC-24, with an average particle size of about 8 μm, manufactured by Tatumori Ltd.) were used in place of 152.6 parts by mass of the silica filler (trade name: TFC-12, with an average particle size of about 4 μm, manufactured by Tatumori Ltd.) as the filler (B).

<Evaluation of the Sealing Film (Resin Layer)>

The sealing film J obtained above was evaluated in the same manner as in Example 1. The results are collectively shown in Table 3.

<Preparation and Evaluation of a Semiconductor Device>

A semiconductor device was prepared and evaluated in the same manner as in Example 1 except that the sealing film J obtained above was used in place of the sealing film A. The results are shown in Table 3.

Example 8

Preparation of a Sealing Film

A film K in a B-stage state (thickness of the resin layer: 150 μm) was obtained in the same manner as in Example 6 except that 1-cyano-1-phenyl imidazole (trade name: Curezole 2PZ-CN, manufactured by Shikoku Chemicals Corporation) was used in an amount of 0.3 part by mass in place of 0.5 part by mass, and 152.6 parts by mass of a silica filler (trade name: TFC-24, with an average particle size of about 8 μm, manufactured by Tatumori Ltd.) were used in place of 152.6 parts by mass of the silica filler (trade name: TFC-12, with an average particle size of about 4 μm, manufactured by Tatumori Ltd.) as the filler (B).

<Evaluation of the Sealing Film (Resin Layer)>

The sealing film K obtained above was evaluated in the same manner as in Example 1. The results are collectively shown in Table 3.

<Preparation and Evaluation of a Semiconductor Device>

A semiconductor device was prepared and evaluated in the same manner as in Example 1 except that the sealing film K obtained above was used in place of the sealing film A. The results are shown in Table 3.

Example 9

Preparation of a Sealing Film

A film L in a B-stage state (thickness of the resin layer: 150 μm) was obtained in the same manner as in Example 7 except that 105.2 parts by mass of a silica filler (trade name: TFC-24, with an average particle size of about 8 μm, manufactured by Tatumori Ltd.) were used in place of 152.6 parts by mass of the silica filler (trade name: TFC-12, with an average particle size of about 4 μm, manufactured by Tatumori Ltd.) as the filler (B).

<Evaluation of the Sealing Film (Resin Layer)>

The sealing film L obtained above was evaluated in the same manner as in Example 1. The results are collectively shown in Table 4.

<Preparation and Evaluation of a Semiconductor Device>

A semiconductor device was prepared and evaluated in the same manner as in Example 1 except that the sealing film L obtained above was used in place of the sealing film A. The results are shown in Table 4.

Example 10

Preparation of a Sealing Film

A film M in a B-stage state (thickness of the resin layer: 150 μm) was obtained in the same manner as in Example 6 except that 209.8 parts by mass of a silica filler (trade name: TFC-24, with an average particle size of about 8 μm, manufactured by Tatumori Ltd.) were used in place of 152.6 parts by mass of the silica filler (trade name: TFC-12, with an average particle size of about 4 μm, manufactured by Tatumori Ltd.) as the filler (B).

<Evaluation of the Sealing Film (resin layer)>

The sealing film M obtained above was evaluated in the same manner as in Example 1. The results are collectively shown in Table 4.

<Preparation and Evaluation of a Semiconductor Device>

A semiconductor device was prepared and evaluated in the same manner as in Example 1 except that the sealing film M obtained above was used in place of the sealing film A. The results are shown in Table 4.

Example 11

Preparation of a Sealing Film

A film N in a B-stage state (thickness of the resin layer: 150 μm) was obtained in the same manner as in Example 7 except that 152.6 parts by mass of a silica filler (trade name: FB-35, with an average particle size of about 10 μm, manufactured by Denki Kagaku Kogyo Kabushiki Kaisha) were used in place of 152.6 parts by mass of the silica filler (trade name: TFC-12, with an average particle size of about 4 μm, manufactured by Tatumori Ltd.) as the filler (B).

<Evaluation of the Sealing Film (Resin Layer)>

The sealing film N obtained above was evaluated in the same manner as in Example 1. The results are collectively shown in Table 4.

<Preparation and Evaluation of a Semiconductor Device>

A semiconductor device was prepared and evaluated in the same manner as in Example 1 except that the sealing film N obtained above was used in place of the sealing film A. The results are shown in Table 4.

TABLE 3

|  |  |  | Example 6 | Example 7 | Example 8 |
|---|---|---|---|---|---|
| Compsition | a1 | HTR860*1 | 33.4 | 33.4 | 33.4 |
|  | a2 | YD8170C*2 | 33.6 | 33.6 | 33.6 |
|  |  | XLC-LL*3 | 33.8 | 33.8 | 33.8 |
|  |  | YDCN703*4 | 0 | 0 | 0 |
|  |  | LF4871*5 | 0 | 0 | 0 |
|  | B | TFC-24*6 | 0 | 152.6 | 152.6 |
|  |  | TFC-12*7 | 152.6 | 0 | 0 |
|  |  | FB-35*8 | 0 | 0 | 0 |
|  |  | SO-C2*9 | 0 | 0 | 0 |

TABLE 3-continued

|  |  |  | Example 6 | Example 7 | Example 8 |
|---|---|---|---|---|---|
|  | C | FP308*10 | 2.5 | 2.5 | 2.5 |
|  | Others | 2PZ-CN*11 | 0.5 | 0.5 | 0.3 |
|  |  | SH6040*12 | 0 | 0 | 0 |
|  |  | A189*13 | 0 | 0 | 0 |
|  |  | A1160*14 | 0 | 0 | 0 |
| Film making conditions (Temp. (° C.)/Time(min)) | 1 bath |  | 90/5 | 90/5 | 90/5 |
|  | 2 bath |  | 140/5 | 140/5 | 140/5 |
| a1/(a1 + a2) | 5~85 |  | 33.13 | 33.13 | 33.13 |
| A | 10 |  | 10 | 10 | 10 |
| B | 5~300 |  | 15.14 | 15.14 | 15.14 |
| C | 0.01~10 |  | 0.25 | 0.25 | 0.25 |
| B-stage film |  |  | I | J | K |
| Film characteristics | Flow (μm) |  | 450 | 700 | 800 |
|  | Film viscosity (Pa·s) | (50° C.) | 70,000 | 60,000 | 60,000 |
|  |  | (100° C.) | 18,000 | 18,000 | 30,000 |
|  | Strage elastic modulus (35° C., MPa) |  | 6,000 | 6,000 | 6,000 |
|  | Tg (° C.) |  | 165 | 165 | 165 |
|  | Thermal decomposition onset point (° C.) |  | 380 | 380 | 380 |
|  | Embedding property |  | ○ | ○ | ○ |
|  | Laser marking visibility | ○ | 100 | 100 | 100 |
|  |  | Δ | 0 | 0 | 0 |
|  |  | x | 0 | 0 | 0 |
| Evaluation of semiconductor device |  |  | 0/10 | 0/10 | 0/10 |

*1 to 14: The same as in Table 1.

TABLE 4

|  |  |  | Example 9 | Example 10 | Example 11 |
|---|---|---|---|---|---|
| Compsition | a1 | HTR860*1 | 33.4 | 33.4 | 33.4 |
|  | a2 | YD8170C*2 | 33.6 | 33.6 | 33.6 |
|  |  | XLC-LL*3 | 33.8 | 33.8 | 33.8 |
|  |  | YDCN703*4 | 0 | 0 | 0 |
|  |  | LF4871*5 | 0 | 0 | 0 |
|  | B | TFC-24*6 | 105.2 | 209.8 | 0 |
|  |  | TFC-12*7 | 0 | 0 | 0 |
|  |  | FB-35*8 | 0 | 0 | 152.6 |
|  |  | SO-C2*9 | 0 | 0 | 0 |
|  | C | FP308*10 | 2.5 | 2.5 | 2.5 |
|  | Others | 2PZ-CN*11 | 0.5 | 0.5 | 0.5 |
|  |  | SH6040*12 | 0 | 0 | 0 |
|  |  | A189*13 | 0 | 0 | 0 |
|  |  | A1160*14 | 0 | 0 | 0 |
| Film making conditions (Temp. (° C.)/Time(min)) | 1 bath |  | 90/5 | 90/5 | 90/5 |
|  | 2 bath |  | 140/5 | 140/5 | 140/5 |
| a1/(a1 + a2) | 5~85 |  | 33.13 | 33.13 | 33.13 |
| A | 10 |  | 10 | 10 | 10 |
| B | 5~300 |  | 10.44 | 20.81 | 15.14 |
| C | 0.01~10 |  | 0.25 | 0.25 | 0.25 |
| B-stage film |  |  | L | M | N |
| Film characteristics | Flow (μm) |  | 1,000 | 600 | 500 |
|  | Film viscosity (Pa·s) | (50° C.) | 80,000 | 40,000 | 65,000 |
|  |  | (100° C.) | 20,000 | 16,000 | 19,000 |
|  | Strage elastic modulus (35° C., MPa) |  | 5,000 | 7,000 | 6,000 |
|  | Tg (° C.) |  | 165 | 165 | 165 |
|  | Thermal decomposition onset point (° C.) |  | 380 | 380 | 380 |
|  | Embedding property |  | ○ | ○ | ○ |
|  | Laser marking visibility | ○ | 100 | 100 | 100 |
|  |  | Δ | 0 | 0 | 0 |
|  |  | x | 0 | 0 | 0 |
| Evaluation of semiconductor device |  |  | 0/10 | 0/10 | 0/10 |

*1 to 14: The same as in Table 1.

Comparative Example 4

Preparation of a Sealing Film

Cyclohexanone was added to a composition consisting of parts by mass of an epoxy group-comprising acrylic rubber (trade name: HTR-860P-3DR, with a weight-average molecular weight of 800,000 and a Tg of −7° C., manufactured by Nagase ChemteX Corporation) as the high-molecular-weight component (a1), 33.6 parts by mass of a bisphenol F epoxy resin (trade name: YD-8170C, with an epoxy equivalent of 160, manufactured by Tohto Kasei Co., Ltd.) and 33.8 parts by mass of a phenol/p-xylylene glycol dimethyl ether copolymer resin (trade name: Mirex XLC-LL, with a hydroxyl equivalent of 174, manufactured by Mitsui Chemicals, Inc.) as the thermosetting component (a2), 0.5 part by mass of 1-cyano-1-phenyl imidazole (trade name: Curezole 2PZ-CN, manufactured by Shikoku Chemicals Corporation), 152.6 parts by mass of a silica filler (trade name: SO-CS, with an average particle size of about 0.4 to 0.6 μm, manufactured by Admafine Co., Ltd.) as the filler (B), and 2.5 parts by mass of a resin processed pigment (trade name: FP BLACK J308, with a carbon black content of 29.0 mass %, manufactured by Sanyo Color Works, Ltd.) as the colorant (C). Then, the mixture was mixed under stirring and then vacuum-degassed to give a varnish with about 60 mass % nonvolatile content (abbreviated hereinafter as NV).

The varnish obtained above was applied onto a substrate layer (trade name: Purex A31, a release agent-treated polyethylene terephthalate film with a film thickness of 38 μm, manufactured by Teijin DuPont Films Japan Limited) and then dried by heating at 90° C. for 5 minutes and then at 140° C. for 5 minutes to form a coating film of 188 μm, whereby a film O in a B-stage state (thickness of the resin layer: 150 μm) was obtained.

<Evaluation of the Sealing Film (Resin Layer)>

The sealing film O obtained above was evaluated in the same manner as in Example 1. The results are collectively shown in Table 5.

<Preparation and Evaluation of a Semiconductor Device>

A semiconductor device was prepared and evaluated in the same manner as in Example 1 except that the sealing film O obtained above was used in place of the sealing film A. The results are shown in Table 5.

Comparative Example 5

Preparation of a Sealing Film

A sealing film P in a B-stage state was obtained in the same manner as in Comparative Example 4 except that the dry conditions of the varnish applied on a substrate layer were 90° C. for 15 minutes and 140° C. for 15 minutes instead of 90° C. for 5 minutes and 140° C. for 5 minutes.

<Evaluation of the Sealing Film (Resin Layer)>

The sealing film P obtained above was evaluated in the same manner as in Example 1. The results are collectively shown in Table 5.

<Preparation and Evaluation of a Semiconductor Device>

A semiconductor device was prepared and evaluated in the same manner as in Example 1 except that the sealing film P obtained above was used in place of the sealing film A. The results are shown in Table 5.

Comparative Example 6

Preparation of a Sealing Film

Cyclohexanone was added to a composition consisting of 4.72 parts by mass of an epoxy group-comprising acrylic rubber (trade name: HTR-860P-3DR, with a weight-average molecular weight of 800,000 and a Tg of −7° C., manufactured by Nagase ChemteX Corporation) as the high-molecular-weight component (a1), 47.04 parts by mass of a bisphenol F epoxy resin (trade name: YD-8170C, with an epoxy equivalent of 160, manufactured by Tohto Kasei Co., Ltd.) and 47.32 parts by mass of a phenol/p-xylylene glycol dimethyl ether copolymer resin (trade name: Mirex XLC-LL, with a hydroxyl equivalent of 174, manufactured by Mitsui Chemicals, Inc.) as the thermosetting component (a2), 0.5 part by mass of 1-cyano-1-phenyl imidazole (trade name: Curezole 2PZ-CN, manufactured by Shikoku Chemicals Corporation) and 2.5 parts by mass of a resin processed pigment (trade name: FP BLACK J308, with a carbon black content of 29.0 mass %, manufactured by Sanyo Color Works, Ltd.) as the colorant (C). Then, the mixture was mixed under stirring and then vacuum-degassed to give a varnish with about 60 mass % nonvolatile content (abbreviated hereinafter as NV).

The varnish obtained above was applied onto a substrate layer (trade name: Purex A31B, a release agent-treated polyethylene terephthalate film with a film thickness of 38 μm, manufactured by Teijin DuPont Films Japan Limited) and then dried by heating at 90° C. for 5 minutes and then at 140° C. for 5 minutes to form a coating film of 188 μm in thickness, whereby a film Q in a B-stage state (thickness of the resin layer: 150 μm) was obtained.

<Evaluation of the Sealing Film (Resin Layer)>

The sealing film Q obtained above was evaluated in the same manner as in Example 1. The results are collectively shown in Table 5.

<Preparation and Evaluation of a Semiconductor Device>

A semiconductor device was prepared and evaluated in the same manner as in Example 1 except that the sealing film Q obtained above was used in place of the sealing film A. The results are shown in Table 5.

Comparative Example 7

Preparation of a Sealing Film

Cyclohexanone was added to a composition consisting of 4.72 parts by mass of an epoxy group-comprising acrylic rubber (trade name: HTR-860P-3DR, with a weight-average molecular weight of 800,000 and a Tg of −7° C., manufactured by Nagase ChemteX Corporation) as the high-molecular-weight component (a1), 47.04 parts by mass of a bisphenol F epoxy resin (trade name: YD-8170C, with an epoxy equivalent of 160, manufactured by Tohto Kasei Co., Ltd.) and 47.32 parts by mass of a phenol/p-xylylene glycol dimethyl ether copolymer resin (trade name: Mirex XLC-LL, with a hydroxyl equivalent of 174, manufactured by Mitsui Chemicals, Inc.) as the thermosetting component (a2), and 0.5 part by mass of 1-cyano-1-phenyl imidazole (trade name: Curezole 2PZ-CN, manufactured by Shikoku Chemicals Corporation). Then, the mixture was mixed under stirring and then vacuum-degassed to give a varnish with about 60 mass % nonvolatile content (abbreviated hereinafter as NV).

The varnish obtained above was applied onto a substrate layer (trade name: Purex A31B, a release agent-treated polyethylene terephthalate film with a film thickness of 38 μm, manufactured by Teijin DuPont Films Japan Limited) and then dried by heating at 90° C. for 5 minutes and then at 140° C. for 5 minutes to form a coating film of 188 μm in thickness, whereby a film R in a B-stage state (thickness of the resin layer: 150 μm) was obtained.

<Evaluation of the Sealing Film (Resin Layer)>

The sealing film R obtained above was evaluated in the same manner as in Example 1. The results are collectively shown in Table 5.

<Preparation and Evaluation of a Semiconductor Device>

A semiconductor device was prepared and evaluated in the same manner as in Example 1 except that the sealing film R obtained above was used in place of the sealing film A. The results are shown in Table 5.

TABLE 5

|  |  |  | Comparative Example 4 | Comparative Example 5 | Comparative Example 6 | Comparative Example 7 |
|---|---|---|---|---|---|---|
| Compsition | a1 | HTR860*1 | 33.4 | 33.4 | 4.72 | 4.72 |
|  | a2 | YD8170C*2 | 33.6 | 33.6 | 47.04 | 47.04 |
|  |  | XLC-LL*3 | 33.8 | 33.8 | 47.32 | 47.32 |
|  |  | YDCN703*4 | 0 | 0 | 0 | 0 |
|  |  | LF4871*5 | 0 | 0 | 0 | 0 |
|  | B | TFC-24*6 | 0 | 0 | 0 | 0 |
|  |  | TFC-12*7 | 0 | 0 | 0 | 0 |
|  |  | FB-35*8 | 0 | 0 | 0 | 0 |
|  |  | SO-C2*9 | 152.6 | 152.6 | 0 | 0 |
|  | C | FP308*10 | 2.5 | 2.5 | 2.5 | 0 |
|  | Others | 2PZ-CN*11 | 0.5 | 0.5 | 0.5 | 0.5 |
|  |  | SH6040*12 | 0 | 0 | 0 | 0 |
|  |  | A189*13 | 0 | 0 | 0 | 0 |
|  |  | A1160*14 | 0 | 0 | 0 | 0 |
| Film making conditions (Temp. (° C.)/Time(min)) |  | 1 bath | 90/5 | 90/15 | 90/5 | 90/5 |
|  |  | 2 bath | 140/5 | 140/15 | 140/5 | 140/5 |
| a1/(a1 + a2) | 5~85 |  | 33.13 | 33.13 | 4.76 | 4.76 |
| A | 10 |  | 10 | 10 | 10 | 10 |
| B | 5~300 |  | 15.14 | 15.14 | 0 | 0 |
| C | 0.01~10 |  | 0.25 | 0.25 | 0.25 | 0 |
| B-stage film |  |  | 0 | P | Q | R |
| Film characteristics | Flow (μm) |  | 140 | 100 | 1900 | 1900 |
|  | Film viscosity (Pa·s) | (50° C.) | 120,000 | 150,000 | 40,000 | 70,000 |
|  |  | (100° C.) | 20,000 | 50,000 | 9,000 | 18,000 |
|  | Strage elastic modulus (35° C., MPa) |  | 6,000 | 6,000 | 2,000 | 6,000 |
|  | Tg (° C.) |  | 165 | 165 | 165 | 165 |
|  | Thermal decomposition onset point (° C.) |  | 380 | 380 | 360 | 380 |
|  | Embedding property |  | x | xx | ○ | ○ |
|  | Laser marking visibility | ○ | 100 | 100 | 0 | 0 |
|  |  | Δ | 0 | 0 | 50 | 0 |
|  |  | x | 0 | 0 | 50 | 100 |
| Evaluation of semiconductor device |  |  | 5/10 | 10/10 | 10/10 | 0/10 |

*1 to 14: The same as in Table 1.

INDUSTRIAL APPLICABILITY

The sealing film of the present invention has protective functions and filling properties, is used in protecting and filling a semiconductor chip, is excellent in filling properties, adhesiveness and shape retention by regulating fluidity at the time of filling, and is thus applicable to various semiconductor devices, electronic parts etc.

The invention claimed is:

1. A semiconductor device comprising a circuit substrate and a semiconductor element on the circuit substrate, wherein the semiconductor element comprises protruded electrodes sealed with a sealing film,
    wherein the sealing film comprises a resin layer containing the following (A), (B) and (C) and having a flow within the range of 150 to 1800 μm at 80° C.:
    (A) a resin component containing (a1) a high-molecular-weight component comprising crosslinking functional groups and having a weight-average molecular weight of 100,000 or more and a Tg within the range of −50 to 50° C. and (a2) a thermosetting component comprising an epoxy resin as a main component,
    (B) a filler having an average particle size within the range of 1 to 30 μm, and
    (C) a colorant, and
    wherein the sealing film contains 1 to 300 parts by mass of the filler (B) and 0.01 to 10 parts by mass of the colorant (C), based on 10 parts by mass of the resin component (A) containing 5 to 85% by mass of the high-molecular-weight component (a1) and 15 to 95% by mass of the thermosetting component (a2).

2. The semiconductor devices according to claim 1, wherein the resin component (A) contains 5 to 80% by mass of the high-molecular-weight component (a1) and 15 to 85% by mass of the thermosetting component (a2).

3. The semiconductor devices film according to claim 2, wherein the sealing film contains 1 to 300 parts by mass of the filler (B) and 0.01 to 10 parts by mass of the colorant (C), based on 10 parts by mass of the resin component (A).

4. The semiconductor device according to claim 1, wherein the filler (B) is an inorganic filler.

5. The semiconductor device according to claim 1, wherein the colorant (C) is a non-white colorant.

6. The semiconductor device according to claim 1, wherein the storage elastic modulus of the resin layer at 35° C. after curing at 170° C. for 1 hour is within the range of 100 to 20000 MPa.

7. The semiconductor device according to claim 1, wherein said flow is within a range of 400 to 1400 μm.

8. The semiconductor device according to claim 1, wherein said resin layer has a viscosity within the range of 10,000 to 100,000 Pa·s in a B-stage state at 50 to 100° C. in thermosetting viscoelasticity measurement.

9. The semiconductor device according to claim 1, further comprising solder balls mounted on the protruded electrodes.

10. A semiconductor device comprising a circuit substrate and a semiconductor element on the circuit substrate, wherein the semiconductor element comprises protruded electrodes sealed with a sealing film,
    wherein the sealing film comprises a resin layer containing the following (A), (B) and (C) and having a viscosity within the range of 10000 to 100000 Pa·s in a B-stage state at 50 to 100° C. in thermosetting viscoelasticity measurement:

(A) a resin component containing (a1) a high-molecular-weight component comprising crosslinking functional groups and having a weight-average molecular weight of 100,000 or more and a Tg within the range of −50 to 50° C. and (a2) a thermosetting component comprising an epoxy resin as a main component, (B) a filler having an average particle size within the range of 1 to 30 μm, and (C) a colorant, and wherein the sealing film contains 1 to 300 parts by mass of the filler (B) and 0.01 to 10 parts by mass of the colorant (C), based on 10 parts by mass of the resin component (A) containing 5 to 85% by mass of the high-molecular-weight component (a1) and 15 to 95% by mass of the thermosetting component (a2).

11. The semiconductor device according to claim 10, wherein the sealing film contains 1 to 300 parts by mass of the filler (B) and 0.01 to 10 parts by mass of the colorant (C), based on 10 parts by mass of the resin component (A).

12. The semiconductor device according to claim 10, wherein the filler (B) is an inorganic filler.

13. The semiconductor device according to claim 2, wherein the colorant (C) is a non-white colorant.

14. The semiconductor device according to claim 10, wherein the storage elastic modulus of the resin layer at 35° C. after curing at 170° C. for 1 hour is within the range of 100 to 20000 MPa.

15. The semiconductor device according to claim 10, wherein said viscosity is within the range of 15000 to 90000 Pa·s in a B-stage state at 50 to 100° C. in thermosetting viscoelasticity measurement.

16. The semiconductor device according to claim 10, further comprising solder balls mounted on the protruded electrodes.

* * * * *

UNITED STATES PATENT AND TRADEMARK OFFICE
CERTIFICATE OF CORRECTION

PATENT NO. : 8,771,828 B2
APPLICATION NO. : 12/299714
DATED : July 8, 2014
INVENTOR(S) : H. Kawakami et al.

It is certified that error appears in the above-identified patent and that said Letters Patent is hereby corrected as shown below:

In the Specification

Please correct Table 1 as shown below:

Please delete Table 1 bridging columns 16 and 17, in its entirety, and substitute therefor the following correct Table 1:

--Table 1

| | | | Example 1 | Example 2 | Example 3 | Example 4 | Example 5 |
|---|---|---|---|---|---|---|---|
| Composition | a1 | HTR860*1 | 12.4 | 12.4 | 12.4 | 12.4 | 12.4 |
| | a2 | YD8170C*2 | 33.6 | 33.6 | 33.6 | 33.6 | 33.6 |
| | | XLC-LL*3 | 33.8 | 33.8 | 33.8 | 33.8 | 33.8 |
| | | YDCN/03*4 | 0 | 0 | 0 | 0 | 0 |
| | | LF4871*5 | 0 | 0 | 0 | 0 | 0 |
| | B | TPC-24*6 | 356.24 | 356.24 | 356.24 | 356.24 | 152.6 |
| | | TPC-12*7 | 0 | 0 | 0 | 0 | 0 |
| | | FB-35*8 | 0 | 0 | 0 | 0 | 0 |
| | | SO-C2*9 | 0 | 0 | 0 | 0 | 0 |
| | C | FP308*10 | 8.3 | 8.3 | 8.3 | 8.3 | 8.55 |
| | Others | 2PZ-CN*11 | 0.1 | 0.1 | 0.1 | 0.1 | 0.1 |
| | | SH6040*12 | 1 | 1 | 1 | 1 | 1 |
| | | A189*13 | 0 | 0 | 0 | 0 | 0 |
| | | A1160*14 | 0 | 0 | 0 | 0 | 0 |
| Film making conditions (Temp. (°C)/Time (min)) | 1 bath | | 90/5 | 90/10 | 90/7 | 90/3 | 90/10 |
| | 2 bath | | 140/5 | 140/10 | 140/7 | 140/3 | 140/10 |
| a1/(a1+a2) | 5~85 | | 15.54 | 15.54 | 15.54 | 15.54 | 15.54 |
| A | 10 | | 10 | 10 | 10 | 10 | 10 |
| B | 5~300 | | 44.64 | 44.64 | 44.64 | 44.64 | 19.12 |
| C | 0.01~10 | | 1.04 | 1.04 | 1.04 | 1.04 | 1.07 |
| Film characteristics | B-stage film | | A | B | C | D | E |
| | Flow (μm) | | 1,000 | 240 | 550 | 1550 | 1,000 |
| | Film viscosity (Pa·s) | (50°C) | 80,000 | 30,000 | 40,000 | 95,000 | 80,000 |
| | | (100°C) | 20,000 | 12,000 | 20,000 | 40,000 | 20,000 |
| | Storage elastic modulus (35°C, MPa) | | 11,000 | 11,000 | 11,000 | 11,000 | 7,000 |
| | Tg (°C) | | 160 | 160 | 160 | 160 | 160 |
| | Thermal decomposition onset point (°C) | | 350 | 350 | 350 | 350 | 350 |
| | Embedding property | | ○ | △ | ○ | ○ | △ |
| | Laser marking visibility | ○ | 100 | 100 | 100 | 100 | 100 |
| | | △ | 0 | 0 | 0 | 0 | 0 |
| | | × | 0 | 0 | 0 | 0 | 0 |
| Evaluation of semiconductor device | | | 0/10 | 1/10 | 0/10 | 1/10 | 2/10 |

Signed and Sealed this
Ninth Day of December, 2014

Michelle K. Lee
*Deputy Director of the United States Patent and Trademark Office*

CERTIFICATE OF CORRECTION (continued)
U.S. Pat. No. 8,771,828 B2

Please correct Table 2 as shown below:

Please delete Table 2 in column 19, in its entirety, and substitute therefor the following correct Table 2:

--Table 2

| | | | Comparative Example 1 | Comparative Example 2 | Comparative Example 3 |
|---|---|---|---|---|---|
| Composition | a1 | HTR860*1 | 12.4 | 12.4 | 12.4 |
| | a2 | YD8170C*2 | 33.6 | 33.6 | 33.6 |
| | | XLC-LL*3 | 33.8 | 33.8 | 33.8 |
| | | YDCN703*4 | 0 | 0 | 0 |
| | | LF4871*5 | 0 | 0 | 0 |
| | B | TFC-24*6 | 0 | 0 | 0 |
| | | TFC-12*7 | 0 | 0 | 0 |
| | | FB-35*8 | 0 | 0 | 0 |
| | | SO-C2*9 | 0 | 0 | 0 |
| | C | FP308*10 | 8.3 | 8.3 | 8.3 |
| | Others | 2PZ-CN*11 | 0.1 | 0.1 | 0.1 |
| | | SH6040*12 | 1 | 1 | 1 |
| | | A189*13 | 0 | 0 | 0 |
| | | A1160*14 | 0 | 0 | 0 |
| Film making conditions (Temp. (°C)/Time (min)) | 1 bath | | [[90/5]] 90/20 | 90/15 | 90/3 |
| | 2 bath | | [[140/5]] 140/20 | 140/15 | 115/3 |
| a1/(a1+a2) | 5~85 | | 15.54 | 15.54 | 15.54 |
| A | 10 | | 10 | 10 | 10 |
| B | 5~300 | | 0 | 0 | 0 |
| C | 0.01~10 | | 1.04 | 1.04 | 1.04 |
| | B-stage film | | F | G | H |
| Film characteristics | Flow (μm) | | 1,400 | 110 | 1,900 |
| | Film viscosity (Pa·s) | (50°C) | 40,000 | 150,000 | 170,000 |
| | | (100°C) | 9,000 | 20,000 | 20,000 |
| | ~~Storage~~ Storage elastic modulus (35°C, MPa) | | 90 | 11,000 | 11,000 |
| | Tg (°C) | | 160 | 160 | 160 |
| | Thermal decomposition onset point (°C) | | 50 | 350 | 350 |
| | Embedding property | | ○ | ×× | × |
| | Laser marking visibility | ○ | 45 | 100 | 100 |
| | | △ | 55 | 0 | 0 |
| | | × | 0 | 0 | 0 |
| Evaluation of semiconductor device | | | 10/10 | 10/10 | 7/10 |

*1 to 14: The same as in Table 1.